(12) United States Patent
Yang et al.

(10) Patent No.: US 12,011,731 B2
(45) Date of Patent: Jun. 18, 2024

(54) FACEPLATE TENSIONING METHOD AND APPARATUS TO PREVENT DROOP

(71) Applicant: APPLIED MATERIALS, INC., Santa Clara, CA (US)

(72) Inventors: Yao-Hung Yang, Santa Clara, CA (US); Shantanu Rajiv Gadgil, Santa Clara, CA (US); Tanmay Pramod Gurjar, Sunnyvale, CA (US); Sudhir R. Gondhalekar, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 313 days.

(21) Appl. No.: 17/365,727

(22) Filed: Jul. 1, 2021

(65) Prior Publication Data

US 2022/0008946 A1    Jan. 13, 2022

Related U.S. Application Data

(60) Provisional application No. 63/050,647, filed on Jul. 10, 2020.

(51) Int. Cl.
*B05B 15/18*    (2018.01)
*B05B 1/18*    (2006.01)
*C23C 16/455*    (2006.01)

(52) U.S. Cl.
CPC .............. *B05B 15/18* (2018.02); *B05B 1/18* (2013.01); *C23C 16/45565* (2013.01)

(58) Field of Classification Search
CPC ...... B05B 15/18; B05B 1/18; C23C 16/45565
See application file for complete search history.

(56) References Cited

U.S. PATENT DOCUMENTS

| 6,410,089 | B1 * | 6/2002 | Guo | .................. C23C 16/45565 |
| | | | | 427/250 |
| 8,721,791 | B2 | 5/2014 | Tiner et al. | |
| 9,449,795 | B2 | 9/2016 | Sabri et al. | |
| 2005/0229848 | A1 | 10/2005 | Siivetti et al. | |
| 2006/0054280 | A1 | 3/2006 | Jang | |
| 2006/0254513 | A1 * | 11/2006 | Kang | ...................... C23C 16/44 |
| | | | | 427/248.1 |
| 2015/0107772 | A1 | 4/2015 | Uchida | |

OTHER PUBLICATIONS

International Search Report for PCT/US2021/040436, dated Oct. 21, 2021.

* cited by examiner

*Primary Examiner* — Qingzhang Zhou
(74) *Attorney, Agent, or Firm* — Moser Taboa

(57) ABSTRACT

Embodiments of showerheads for use in a process chamber and methods of reducing drooping of a showerhead faceplate are provided herein. In some embodiments, a showerhead for use in a process chamber includes: a faceplate having a plurality of gas distribution holes disposed therethrough; and one or more cables that engage with the faceplate and configured to prestress the faceplate.

11 Claims, 5 Drawing Sheets

FACEPLATE TENSIONING METHOD AND APPARATUS TO PREVENT DROOP

CROSS-REFERENCE TO RELATED APPLICATIONS

This application claims benefit of U.S. provisional patent application Ser. No. 63/050,647, filed Jul. 10, 2020 which is herein incorporated by reference in its entirety.

FIELD

Embodiments of the present disclosure generally relate to semiconductor substrate processing equipment.

BACKGROUND

Conventional showerheads utilized in semiconductor process chambers (e.g., deposition chambers, etch chambers, or the like) typically include a showerhead for introducing one or more process gases into a process volume of the process chamber. The showerhead includes a faceplate having one or more through holes for distributing the one or more process gases. The faceplate is typically supported along an outer edge of the faceplate. However, under thermal cycling, the faceplate may droop, causing deposition nonuniformity across a substrate being processed.

Accordingly, the inventors have provided embodiments of an improved showerhead.

SUMMARY

Embodiments of showerheads for use in a process chamber and methods of reducing drooping of a showerhead faceplate are provided herein. In some embodiments, a showerhead for use in a process chamber includes: a faceplate having a plurality of gas distribution holes disposed therethrough; and one or more cables that engage with the faceplate and configured to prestress the faceplate.

In some embodiments, a process chamber includes: a chamber body coupled to a chamber lid to define an interior volume therein; a substrate support disposed in the interior volume; and a faceplate having an outer periphery that rests on the chamber body, wherein the faceplate includes a plurality of gas distribution holes extending therethrough disposed in the interior volume opposite the substrate support, wherein one or more cables are disposed proximate the outer periphery of the faceplate and configured to prestress the faceplate.

In some embodiments, a method of reducing drooping of a faceplate for use in a process chamber includes applying a compressive force to the faceplate via one or more cables that engage with the faceplate proximate an outer periphery thereof.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
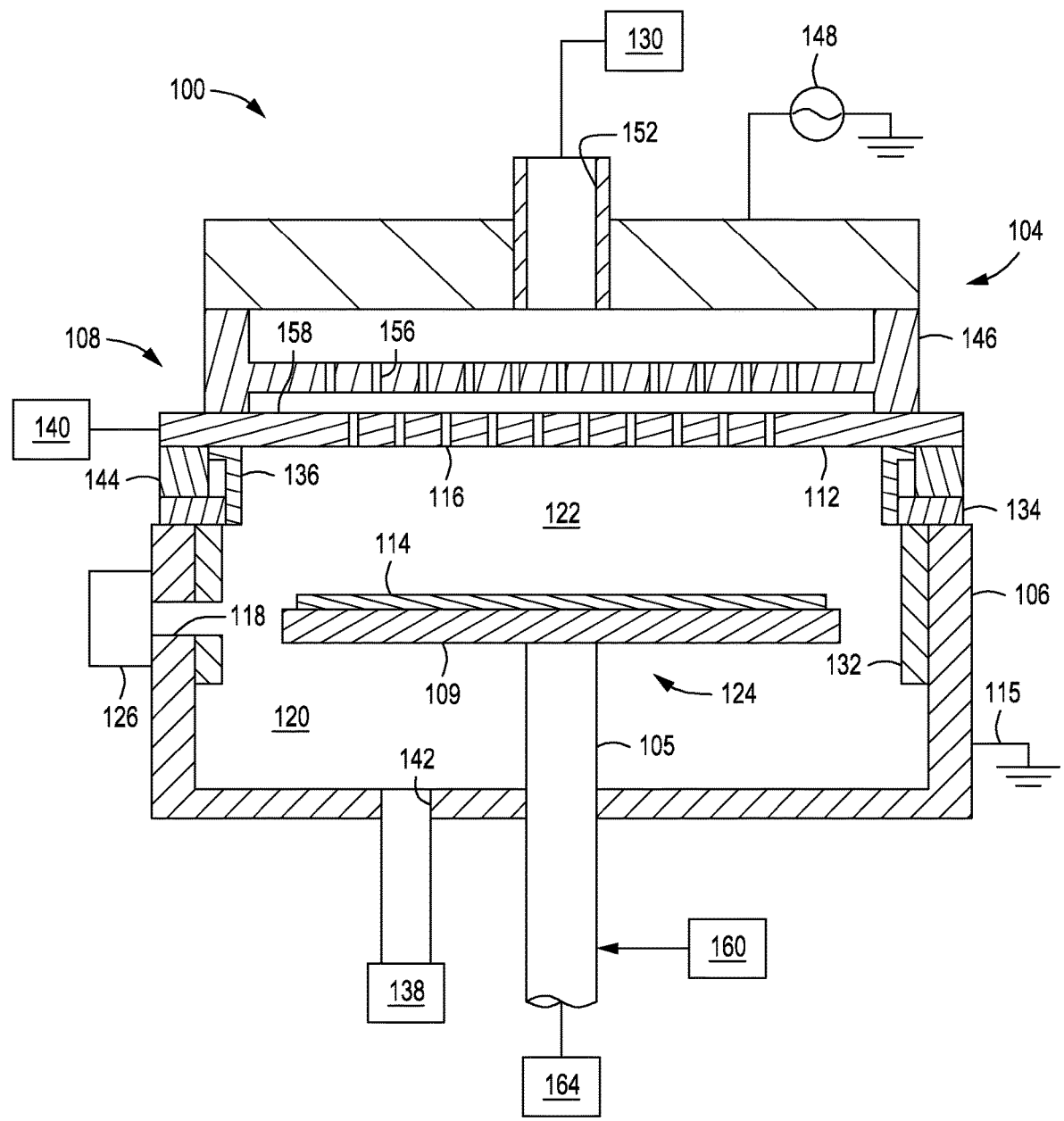
FIG. 1 depicts a schematic side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of showerheads for use in a process chamber are provided herein. The showerheads described herein include a faceplate having one or more openings to flow one or more process gas into a process volume of the process chamber to perform a process on a substrate disposed in the process chamber. The faceplate may be supported proximate an outer edge region of the faceplate. The faceplate may deform or droop at a central region due to at least one of a weight of the faceplate or thermal cycling of the faceplate. The apparatus and methods provided herein include one or more cables embedded within or otherwise coupled to the faceplate to prestress the faceplate to advantageously reduce drooping of the faceplate (i.e., increase a flatness of the faceplate) when installed in the process chamber. The faceplate, having increased flatness, advantageously improves process uniformity on the substrate.

FIG. 1 depicts a schematic side view of a process chamber in accordance with some embodiments of the present disclosure. The process chamber 100 may be any chamber having a showerhead to perform any suitable process, such as an etching process, a deposition process, a cleaning process, or the like. In some embodiments, the process chamber 100 is configured to perform a plasma enhanced chemical vapor deposition (PECVD) process.

The process chamber 100 includes a chamber body 106 coupled to a lid assembly 104 to define an interior volume 120 therein. The chamber body 106 is generally made of metal such as aluminum. The chamber body 106 includes a slit valve opening 118 formed in a sidewall thereof. The slit valve opening 118 is coupled to a slit valve 126 for selectively opening and closing the slit valve opening 118 to facilitate the transfer of the substrate 114 into and out of the interior volume 120. The chamber body 106 may be coupled to ground 115.

The lid assembly 104 includes a showerhead 108 for providing one or more process gases into the interior volume 120. A substrate support 124 is disposed in the interior volume 120 opposite the showerhead 108 to support a substrate 114. The substrate support 124 and the showerhead 108 define a process volume 122 therebetween. The showerhead 108 includes a faceplate 112 having an outer periphery that rests on the chamber body 106. The faceplate 112 includes a plurality of gas distribution holes 116 extending therethrough to provide one or more process gases from a gas supply 130 to the process volume 122. The faceplate 112 may be made of a metal such as aluminum.

The process chamber 100 includes a vacuum port 142 coupled to the interior volume 120. The vacuum port 142 is coupled to a vacuum system 138 having a vacuum pump and a throttle valve to regulate a flow of gases through the process chamber 100.

The substrate support 124 generally includes a pedestal 109 disposed on a support shaft 105. The support shaft 105 may be coupled to a lift mechanism 160. The lift mechanism 160 may be flexibly sealed to the chamber body 106. The lift mechanism 160 allows the pedestal 109 to be moved vertically within the interior volume 120 between a lower transfer portion and a number of raised process positions. Additionally, one or more lift pins (not shown) may be disposed through the pedestal 109 to raise or lower the substrate 114 off of or onto the pedestal 109.

One or more cables (described in more detail below) are coupled to the faceplate 112 to prestress the faceplate 112. In some embodiments, the one or more cables are disposed proximate the outer periphery of the faceplate 112. In some embodiments, the one or more cables are coupled to a tensioning mechanism 140 configured to pull the one or more cables to prestress the faceplate 112. In some embodiments, the tensioning mechanism 140 may be any suitable tensioner tool for applying a tensile force on the one or more cables. In some embodiments, the tensioning mechanism 140 is configured to pull the one or more cables while pushing against an outer sidewall of the faceplate 112. In some embodiments, the tensioning mechanism 140 is configured to pull the one or more cables while not pushing against an outer sidewall of the faceplate 112. In some embodiments, the tensioning mechanism comprises a pneumatic tensioner. In some embodiments, the one or more cables are anchored, clamped, or otherwise locked once tensioned by the tensioning mechanism 140 prior to removing the tensile force of the tensioning mechanism.

In some embodiments, the showerhead 108 includes a blocker plate 146 having a plurality of through holes 156 coupled to an upper surface 158 of the faceplate 112. The blocker plate 146 is configured to more uniformly distribute the one or more process gases from the gas supply 130 to the faceplate 112. In some embodiments, a flow path of the one or more process gases extends from the gas supply 130 to a gas inlet 152 of the lid assembly 104, through the blocker plate 146, and through the faceplate 112 to the process volume 122. The blocker plate 146 may also provide a desired pressure drop of the one or more process gases between the gas supply 130 and the faceplate 112.

In some embodiments, the faceplate 112 is disposed on a conductive ring 144 to provide an RF ground path. The conductive ring 144 may be made of aluminum. In some embodiments, the chamber body 106 includes one or more liners that surround the substrate support 124 to protect walls of the chamber body 106. In some embodiments, the one or more liners includes a lower liner 132. In some embodiments, the one or more liners includes an upper liner 134 disposed between the lower liner 132 and the showerhead 108. In some embodiments, the faceplate 112 may also rest on a ceramic isolator ring 136 disposed between the process volume 122 and the conductive ring 144 to provide additional edge support for the faceplate 112. In some embodiments, the ceramic isolator ring 136 extends from the faceplate 112 to the lower liner 132. In some embodiments, the ceramic isolator ring 136 has an "L" shaped cross section.

The lid assembly 104 is coupled to a power source 148, such as an RF power supply. In use, the power source 148 energizes one or more components of the lid assembly 104 to form or maintain a plasma in the process volume 122. The ions of the plasma may be used to perform a desired deposition, etch, or cleaning process. In some embodiments, a second power source 164 may be coupled to the substrate support 124 to provide an additional bias by increasing electric potential from the plasma to the substrate 114. The second power source 164 may be DC power, pulsed DC power, RF bias power, pulsed RF source or bias power, or a combination thereof.

Figure 2:
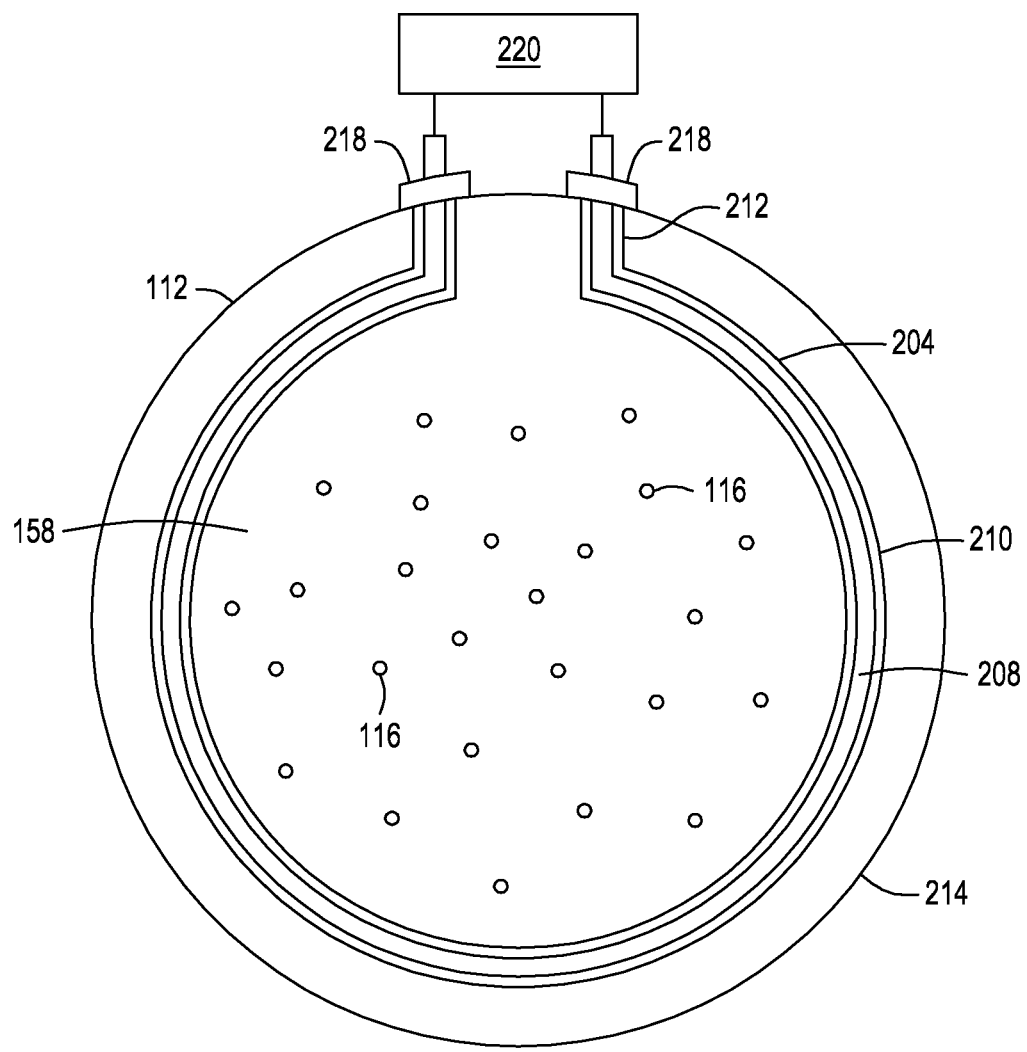
FIG. 2 depicts a schematic top view of a faceplate in accordance with some embodiments of the present disclosure.
Figure 3:
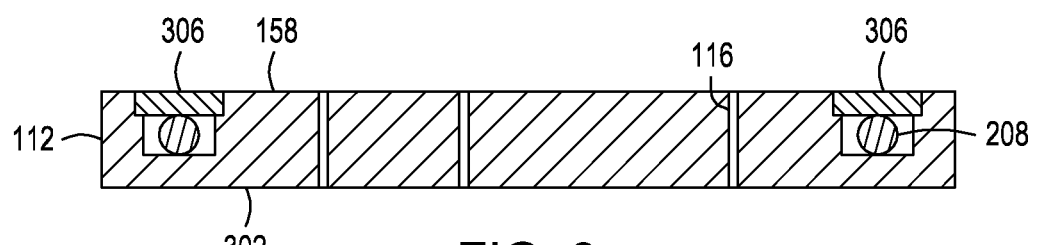
FIG. 3 depicts a side view of a faceplate in accordance with some embodiments of the present disclosure.

FIG. 2 depicts a schematic top view of a faceplate 112 in accordance with some embodiments of the present disclosure. FIG. 3 depicts a schematic cross-sectional view of a faceplate 112 in accordance with some embodiments of the present disclosure. In some embodiments, one or more cables 208 are embedded in the faceplate 112. In some embodiments, the faceplate 112 includes one or more channels 204 to accommodate the one of more cables 208 disposed therein. In some embodiments, the one or more cables 208 are disposed radially outward of the plurality of gas distribution holes 116.

In some embodiments, as shown in FIG. 2, the one or more channels 204 is a single channel. In some embodiments, the one or more channels 204 include an annular portion 210 extending about an outer periphery of the faceplate 112 and radial portions 212 extending from the annular portion 210 to an outer sidewall 214 of the faceplate 112. In some embodiments, the one or more channels 204 are disposed on the upper surface 158 of the faceplate 112. In some embodiments, one or more cover plates 306 are disposed over the one or more cables 208 to cover the one or more channels 204. The one or more cover plates 306 may be welded to or other wise coupled to the faceplate 112. In some embodiments, the one or more channels 204 are disposed on a lower surface 302 of the faceplate 112.

In some embodiments, the one or more cables 208 are made of a metal. In some embodiments, the one or more cables 208 comprise a metal bar or a plurality of interwoven metal strands. In some embodiments, the one or more cables 208 comprise a plurality of interwoven stainless-steel strands. The one or more cables 208 may be coupled to a tensioning mechanism 220 configured to pull ends of the one or more cables 208 to stress the one or more cables 208 and thereby prestress the faceplate 112. A locking device may be coupled to the one or more cables 208 to maintain the faceplate 112 in the prestressed state. For example, the locking device may be an anchor 218 coupled to each end of the one or more cables 208 and configured to maintain the one or more cables 208 in a stressed position to prestress the faceplate 112. The anchor 218 is generally larger in size than a width of the one or more channels 204 such that the anchor 218 presses against the outer sidewall 214 of the faceplate 112, locking the one or more cables 208 in a stressed position.

Figure 4:
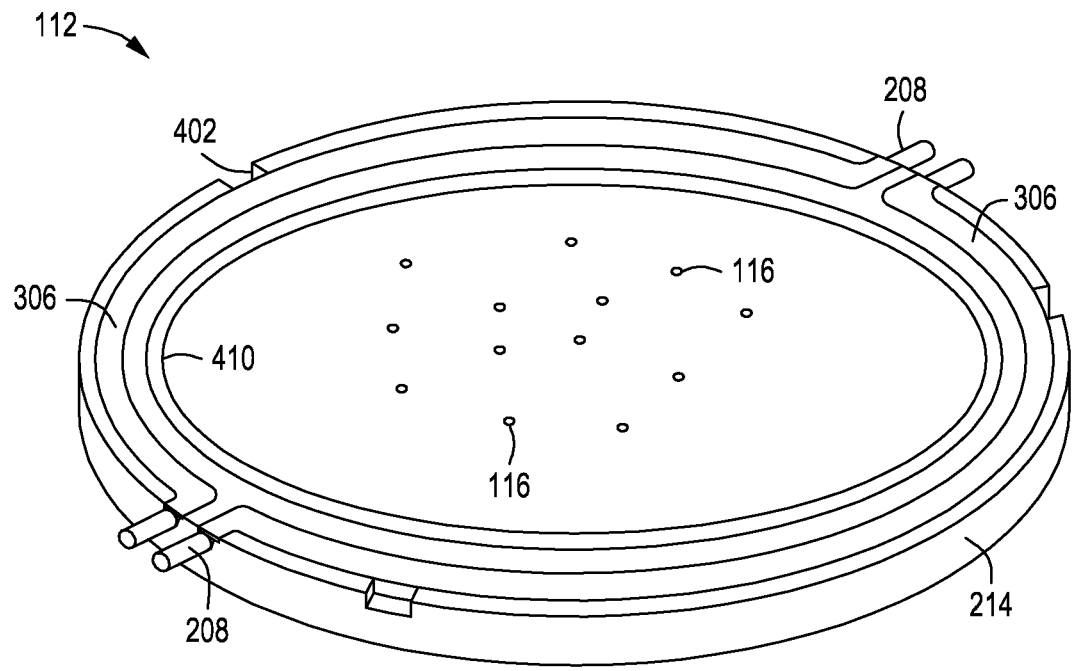
FIG. 4 depicts an isometric top view of a faceplate in accordance with some embodiments of the present disclosure.
Figure 5:
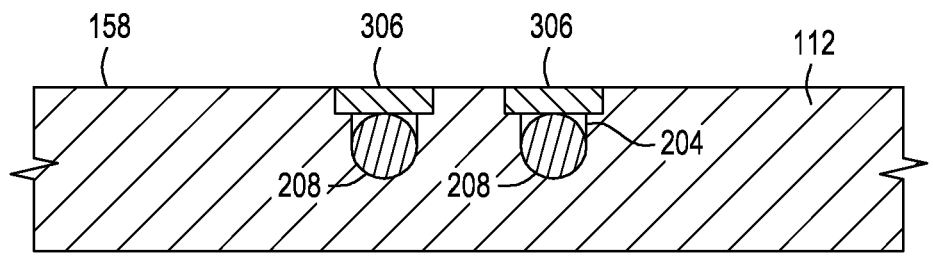
FIG. 5 depicts a partial cross-sectional view of a faceplate in accordance with some embodiments of the present disclosure.

FIG. 4 depicts an isometric top view of a faceplate 112 in accordance with some embodiments of the present disclosure. FIG. 5 depicts a partial side view of a faceplate 112 in accordance with some embodiments of the present disclosure. In some embodiments, as shown in FIG. 4, the one or more channels 204 comprise two channels. In some embodiments, each of the two channels have an annular portion and a pair of radial portions. In some embodiments, the radial portions of each of the two channels are disposed approximately 180 degrees from each other. In such embodiments, a tensioning mechanism (i.e., tensioning mechanism 220) is disposed on both sides of the faceplate 112 to pull the one or more cables 208.

In some embodiments, the upper surface 158 of the faceplate 112 includes an annular seal groove 410 disposed radially inward from the one or more cables 208 to provide a seal between the blocker plate 146 and the faceplate 112. In some embodiments, the faceplate 112 includes one or more alignment features 402 to align the faceplate 112 with chamber components, for example, the blocker plate 146. In some embodiments, the one or more alignment features 402 comprise three alignment features.

Figure 6:
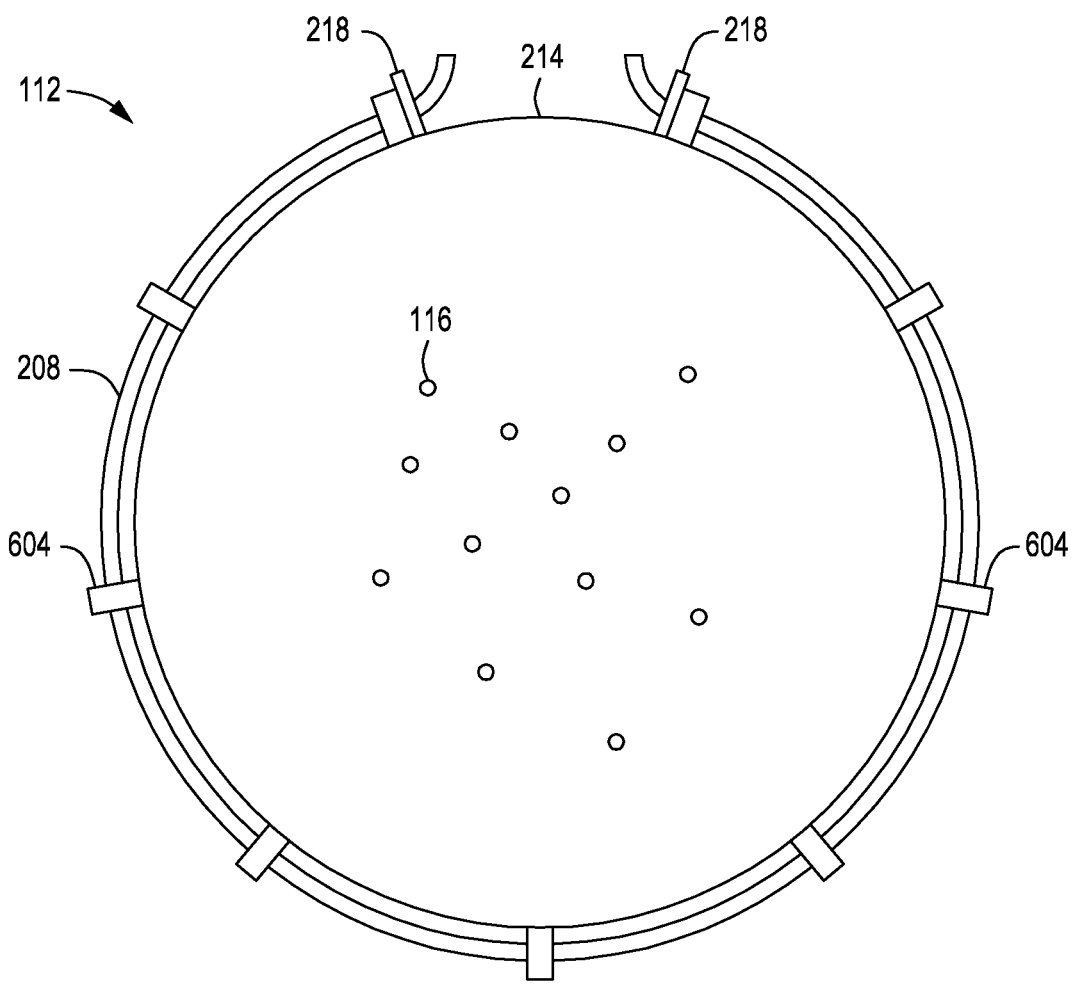
FIG. 6 depicts a schematic top view of a faceplate in accordance with some embodiments of the present disclosure.
Figure 7:
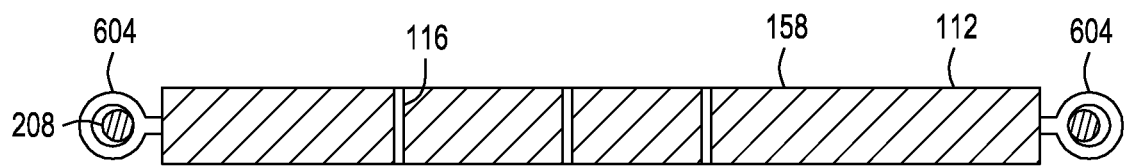
FIG. 7 depicts a schematic cross-sectional view of a faceplate in accordance with some embodiments of the present disclosure.

FIG. 6 depicts a schematic top view of a faceplate 112 in accordance with some embodiments of the present disclosure. FIG. 7 depicts a schematic cross-sectional view of a faceplate 112 in accordance with some embodiments of the present disclosure. In some embodiments, a plurality of holding members 604 are coupled to an outer sidewall 214 of the faceplate 112. In some embodiments, the plurality of holding members 604 are eye hooks or the like. The plurality of holding members 604 facilitate the one or more cables 208 extending therethrough to prestress the faceplate 112. Anchors 218 are coupled to the one or more cables 208 and press against the outer sidewall 214 of the faceplate 112 or against corresponding ones of the plurality of holding members 604 to maintain the one or more cables 208 in a stressed position.

Figure 8:
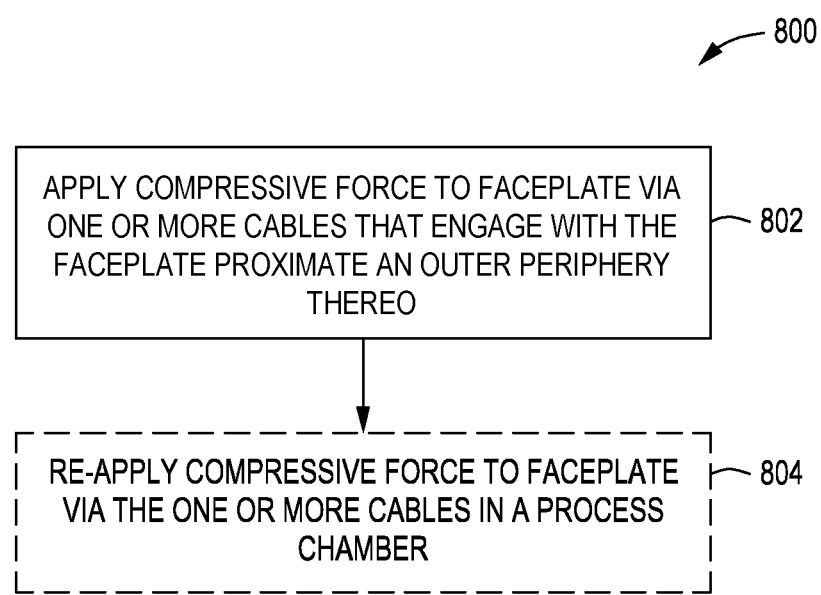
FIG. 8 depicts a method of reducing drooping of a faceplate in accordance with some embodiments of the present disclosure.

FIG. 8 depicts a method 800 of reducing drooping of a faceplate for use in a process chamber in accordance with some embodiments of the present disclosure. At 802, the method includes applying a compressive force to the faceplate (i.e., faceplate 112) via one or more cables (i.e., the one or more cables 208) that engage with the faceplate proximate an outer periphery thereof. The one or more cables engage with the faceplate in any suitable manner to apply the compressive force, for example, by being disposed in, coupled to, pressing against, or otherwise in contact with the faceplate. In some embodiments, applying the compressive force comprises providing a tensile force to the one or more cables. For example, the tensile force may be applied by a tensioning mechanism (i.e. tensioning mechanism 140, 220). In some embodiments, applying the compressive force comprises pulling on both ends of the one or more cables to prestress the faceplate to reduce or prevent drooping of the faceplate, for example, at a center of the faceplate. In some embodiments, applying the compressive force comprises pulling on one end of the one or more cables while the other end is anchored, clamped, or otherwise fixed. In some embodiments, prestressing the faceplate is performed ex-situ, before the faceplate is installed in the process chamber (i.e., process chamber 100). In some embodiments, prestressing the faceplate is performed in-situ, after the faceplate is installed in the process chamber to advantageously reduce time for preventative maintenance. In some embodiments, subsequent to applying a compressive force to the faceplate, anchors (i.e., anchors 218) or other clamping or locking device may be coupled to the one or more cables to maintain the one or more cables in a pulled or stressed state. In some embodiments, the anchors or other locking or clamping device is coupled to the one or more cables before removing the tensile force to the one or more cables.

Over time, the one or more cables may relax, reducing the prestress in the faceplate. Optionally, at 804, the method includes subsequently re-applying the compressive force to the faceplate via the one or more cables in the process chamber after the faceplate is installed in the process chamber. In some embodiments, the re-applying of the compressive force may be performed at regular intervals, for example, after performing a set number of processes or after a first period of time. The anchors or other locking device may be repositioned after re-applying the compressive force to the faceplate to maintain the one or more cables in the stressed state.

While the foregoing is directed to embodiments of the present disclosure, other and further embodiments of the disclosure may be devised without departing from the basic scope thereof.

The invention claimed is:

1. A showerhead for use in a process chamber, comprising:
   a faceplate having a plurality of gas distribution holes disposed therethrough; and
   one or more cables that engage with the faceplate and configured to prestress the faceplate, wherein the faceplate includes one or more channels on an upper surface thereof to accommodate the one or more cables, wherein the one or more channels include an annular portion extending about an outer periphery of the faceplate and radial portions extending from the annular portion to an outer sidewall of the faceplate.

2. The showerhead of claim 1, further comprising one or more cover plates disposed on the faceplate to cover the one or more channels.

3. The showerhead of claim 1, wherein the one or more channels comprise two channels and the radial portions of each of the two channels are disposed approximately 180 degrees from each other.

4. The showerhead of claim 1, wherein the one or more cables are disposed radially outward of the plurality of gas distribution holes.

5. The showerhead of claim 1, wherein the one or more cables comprise a plurality of interwoven metal strands.

6. The showerhead of claim 1, further comprising an anchor coupled to each end of the one or more cables and configured to maintain the one or more cables in a stressed position to prestress the faceplate.

7. The showerhead of claim 1, wherein an upper surface of the faceplate includes an annular seal groove disposed radially inward from the one or more cables.

8. The showerhead of claim 1, further comprising a blocker plate having a plurality of through holes coupled to an upper surface of the faceplate.

9. A process chamber, comprising:
   a chamber body coupled to a lid assembly to define an interior volume therein;
   a substrate support disposed in the interior volume; and
   a faceplate having an outer periphery that rests on the chamber body, wherein the faceplate includes a plurality of gas distribution holes extending therethrough disposed in the interior volume opposite the substrate support, wherein one or more cables are disposed proximate the outer periphery of the faceplate and configured to prestress the faceplate, wherein the faceplate includes one or more channels on an upper surface thereof to house the one or more cables, and wherein one or more cover plates are disposed over the one or more cables to cover the one or more channels.

10. The process chamber of claim 9, wherein the one or more cables are embedded in the faceplate.

11. The process chamber of claim 9, further comprising an upper liner and a lower liner surrounding the substrate support.

\* \* \* \* \*